United States Patent [19]

Bailey et al.

[11] Patent Number: 5,369,652
[45] Date of Patent: Nov. 29, 1994

[54] ERROR DETECTION AND CORRECTION HAVING ONE DATA FORMAT RECORDABLE ON RECORD MEDIA USING A DIVERSE NUMBER OF CONCURRENTLY RECORDED TRACKS

[75] Inventors: Charles E. Bailey; Ernest S. Gale; Carl A. Hassell; Scott J. Schaffer; Sushama M. Paranjape; Stephen C. West, all of Tucson, Ariz.

[73] Assignee: International Business Machines Corporation, Armonk, N.Y.

[21] Appl. No.: 75,944

[22] Filed: Jun. 14, 1993

[51] Int. Cl.⁵ .................. H03M 13/00; G11B 5/09
[52] U.S. Cl. .................. 371/40.1; 360/47; 360/53
[58] Field of Search .............. 371/40.1–40.4, 371/39, 37.4, 37.5–39.1; 340/146.1 AL; 360/39–54

[56] References Cited

U.S. PATENT DOCUMENTS

| | | | |
|---|---|---|---|
| Re. 33,332 | 9/1990 | Furuya et al. ............... | 371/40.3 |
| 3,800,281 | 3/1974 | Devore et al. ............. | 340/146.1 AL |
| 3,868,632 | 2/1975 | Hong et al. ............... | 340/146.1 AQ |
| 3,985,016 | 8/1972 | Eachus .................. | 371/37.4 |
| 4,052,698 | 10/1977 | Ragle .................... | 340/146.1 AL |
| 4,646,170 | 2/1987 | Kobayashi et al. .......... | 371/39 |
| 4,727,547 | 2/1988 | Brandes ................. | 371/39 |
| 4,796,110 | 1/1989 | Glass et al. .............. | 371/39 |
| 4,882,732 | 11/1989 | Kaminaga ............... | 371/40.1 |
| 4,908,826 | 3/1990 | Hertrich ................ | 371/40.1 |
| 5,003,541 | 3/1991 | Mester .................. | 371/40.1 |
| 5,151,905 | 9/1992 | Yokono et al. ........... | 371/40.1 |
| 5,172,381 | 12/1992 | Karp et al. .............. | 371/40.3 |

Primary Examiner—Joseph Ruggiero
Assistant Examiner—Jim Trammell
Attorney, Agent, or Firm—H. F. Somermeyer

[57] ABSTRACT

A data storage system has error detecting and correcting system having three error codes. The data are arranged logically as a three-dimensional array consisting of a plurality of logically rectangular blocks of data. Each block of data has columns and rows of data. A first error code that corrects errors creates a first redundancy in each of the columns. A like-positioned block row of data in each of the blocks constitutes an array row of data. The array rows are grouped into sets of array rows, the number of array rows in each set vary inversely with a number of tracks of a record medium that concurrently receive the data for recording. Each set of data are recorded serially by bit in respective tracks of the tape record medium. Before recording, the block rows are logically rotated (end-around shifted) within each of the array rows. The block row shifting is different for each set such that the lateral alignment of data are changed for avoiding medium defects extending transversely of the tracks from creating excessive errors in any column of data. After the block row shifting, a second error code is applied to each block row while a third error code is applied to each array row. Readback is a reversal of the writing process. Error pointers are generated from the second and third redundancies as well as from signal and data format errors.

27 Claims, 5 Drawing Sheets

ERROR DETECTION AND CORRECTION HAVING ONE DATA FORMAT RECORDABLE ON RECORD MEDIA USING A DIVERSE NUMBER OF CONCURRENTLY RECORDED TRACKS

FIELD OF THE INVENTION

The present invention relates to error detection and correction systems, particularly to those systems using multi-track media, such as magnetic tapes that are used as data interchange media.

BACKGROUND OF THE INVENTION

Magnetic tape media have been used for many years as a data storage or record medium, particularly for data interchange. Such magnetic tape media started out with a few (7-9) record or data tracks. Even with such few tracks, magnetic tape media and the associated tape drives exhibited several error causing characteristics. Error detection and correction systems have been widely employed to accommodate and correct errors arising in the storage and retrieval of data on and from such magnetic tape media. Over the years, it has also been desired that the areal recording density be increased. In achieving this desire, error detection and correction systems have been successfully used. Such error detection and correction systems had many restraints, that is, the error detection and correction should either provide error detection and correction in "real time" or with a minimal delay in error detection and correction data processing.

Currently, it is desired that one-half inch magnetic tape media employ a number of tracks in the hundreds, such as 128, etc. Concurrently, the longitudinal density has also been substantially increased to more than 2500 flux changes per millimeter. Such higher longitudinal and track densities create greater sensitivities that result in greater number of data errors. Media surface perturbations, head to medium relationships and the like co-act to create error-prone recording and reproduction. It is known that such error-prone conditions can be alleviated by dispersing the recording of data from each data record, block, file, etc. over a magnetic tape medium. It is also desired to provide for such dispersal in a minimal area for facilitating rapid recording and reproduction of data. According to the present invention, such dispersal can be in a minimal area yet provide enhanced recording and reproduction reliability by dispersing the data in accordance with the error detecting and correcting data format. Such dispersal is provided such that advantages of the dispersal are achieved with a variety of track densities without changing the basic data format. Therefore, the data format plays an important role in obtaining high quality data recording and reproduction.

An error producing magnetic tape media syndrome is a change in signal-to-noise ratios (SNR). The lower the SNR, the greater the probability of causing a data error. Accordingly, it is desired to employ error detection and correction (ECC) systems in a manner for accommodating reduced SNR.

A known error detection and correction algorithm is the so-called BCH codes. A simplified subset of the BCH codes are the well known Reed-Solomon codes. Many types of error detection and correction coding have been used with recording and reproduction on and from magnetic tape media. So-called error pointers have been used to enhance the error correction capabilities of all ECC systems. So-called "dead tracking" has been used in magnetic tape media to indicate that a read circuit for the so-called "dead track" is so out of synchronism with the read signal that no valid data are being sensed from the one track—this fact is a pointer for the ECC that all signals from the dead track are in error. Other error pointers have been used over the years for error pointing. Of course, some of the error pointers can be generated by the ECC; however, to extend the error correction beyond the usage of the ECC generated pointers, external error pointers are required.

The Reed-Solomon codes have been used with disk recording media in the form of so-called inner-outer codes. An outer code has sufficient redundancy for providing relatively powerful error detection and correction. The inner code may have a lesser redundancy and capability than the outer code. The inner code may be used as a source of error pointers to be used by the outer code. Both the inner and outer codes can be Reed-Solomon based codes.

SUMMARY OF THE INVENTION

The present invention enhances error control by relatively displacing data within rows of a rectangular (columns and rows of data bytes) ECC code/data block differing amounts such that in a multi-track record medium, a first row of data (each row has a plurality of data bytes) in every data storage area, such as a portion of a data track, begins with a data row having a predetermined rotated ECC array position from a row of data in an adjacent record track. An ECC redundancy (outer code) for error detection and correction is arranged in columns that extend orthogonal to the rows. In a preferred form, a plurality of rows of data are in one of a plurality of sets. Each set of data is recorded in an addressable area (track portion). The logical position of the rows in each set stored in a different addressable areas is rotated, as by end-around rotating (shifting) the rows of data in respective groups of rows in each set for obtaining the diverse data displacements in physically/logically adjacent addressable data storage areas or tracks.

A second or inner code detects data errors in respective ones of the rows of data bytes, each row being completely stored in one of the tracks. An additional or third ECC code is applied to a predetermined number of data rows, termed an array row, stored in the respective tracks. Such third ECC code detects (may correct) data errors in each array row of said data bytes and first ECC code redundancies stored in respective ones of the tracks. Such third ECC detection also detects and corrects errors in the inner and outer code redundancies.

In an illustrated form of the invention, an array of data bytes to be recorded is arranged in a three dimensional logical array (the three dimensional array may be stored in a single plane or X-Y random access memory (RAM)). The data bytes are arranged into a plurality of logically aligned data planes, each data plane containing one block of the data, hereinafter referred to as blocks. Each of the blocks have a rectangular array of the data bytes in rows and columns. The rows are also termed block rows. The block rows having a same relative logical position in each block constitute an array row.

The outer ECC code is applied to each of the columns separately in the blocks for creating an first ECC redundancy in each of the respective data columns. The entire created array of data bytes and outer ECC code redundancy bytes is then divided into sets, each set having a plurality of the block rows in one or more array rows of data/first redundancy bytes, i.e. first and second ones of the array rows may constitute one set. The block rows of data bytes in each set are end-around rotated within a respective array row, the block row rotation being the same in all array rows of one set (a first set has no block row rotation, a second set has rotation by one row, etc.). Accordingly, block rows of data bytes in the respective sets are displaced from their respective original columnar locations by respective different rotations that are dependent in which addressable data storage area or track the set is to be stored. Then, based upon the number of tracks to receive and store the created array, one or more of the sets of data bytes are recorded in respective ones of the tracks.

After the above described block row rotation, an inner or second ECC code (for detecting data errors but not correcting same) is applied separately to each of the block rows of data bytes in all of the blocks resulting in a second ECC redundancy in each of the rows, effectively adding a logical column of second ECC redundancy bytes. The second ECC code is for detecting an error in the block rows for creating an error pointer to the block row.

A third ECC is applied to the data in the write track circuits after the rotation and set selection for generating a third redundancy in each of the respective tracks respectively for each array row. The third ECC is for creating error pointers/correction to the respective array row portions of the sets.

Reproduction of the data from the record medium first includes, on a track basis, applying the third ECC to detect and correct some of the detected errors in the read array rows. Then, the second ECC generates error pointers for the respective block rows of data bytes. The sets of data bytes are de-interleaved and de-rotated for restoring the read data bytes to their respective original locations in the created array to generate a retrieved array in a buffer. The error pointers are associatively buffered with the rows and sets. Finally, the outer ECC is applied to the respective columns of data bytes using the buffered error pointers to point to bytes in error of the respective columns to create error free data.

The foregoing and other objects, features and advantages of the invention will be apparent from the following more particular description of preferred embodiments of the invention, as illustrated in the accompanying drawings.

DETAILED DESCRIPTION

Figure 1:
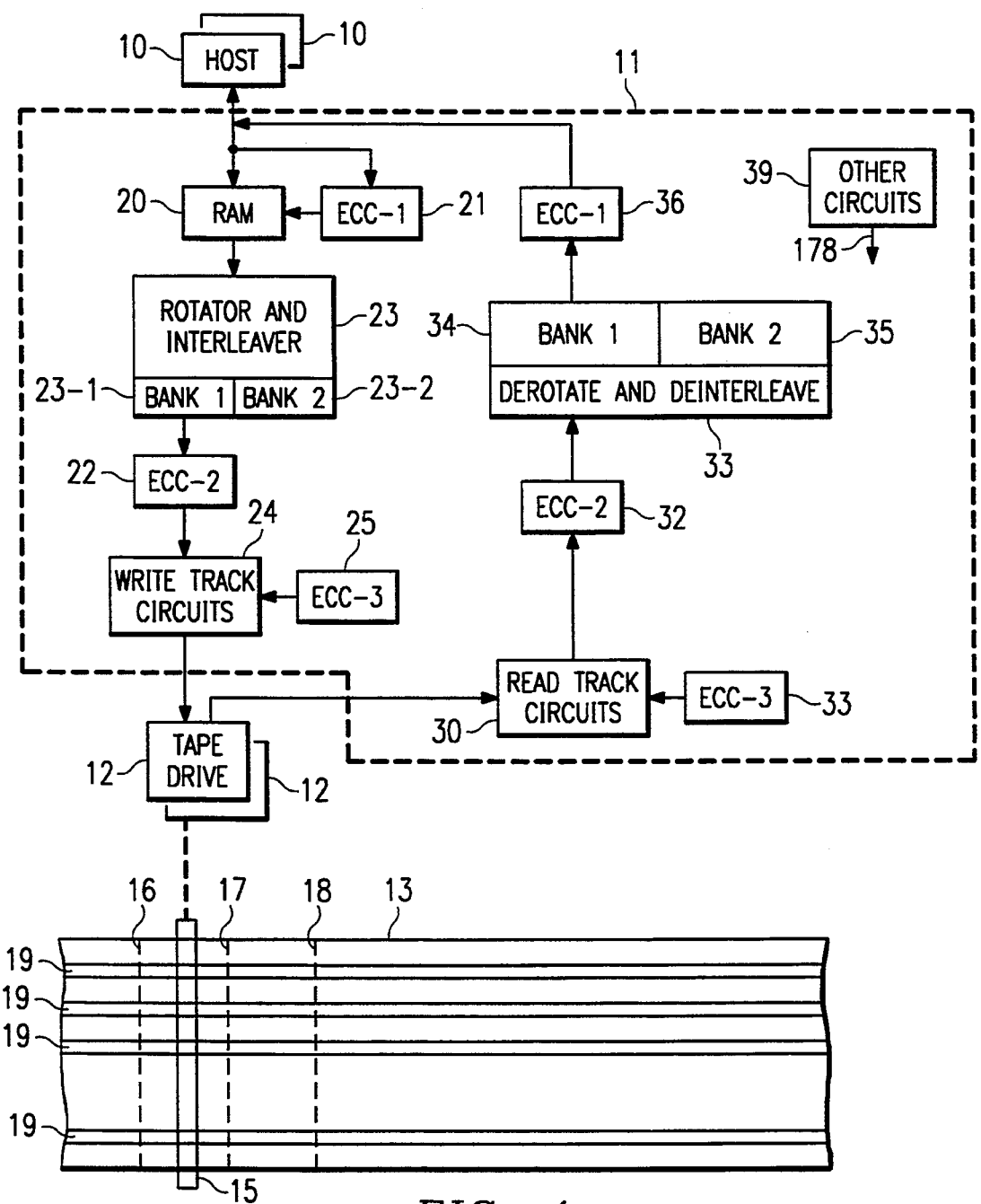
FIG. 1 illustrates, in simplified block diagram form, a peripheral data storage subsystem in which the present invention is employed together with a diagrammatic showing of a magnetic tape medium used in the subsystem.

Referring now more particularly to the appended drawing, like numerals indicate like parts and structural features in the various figures. One or more host processors 10 attach a data storage subsystem that comprises peripheral controller 11 and a plurality of one-half inch high-performance magnetic tape drives 12. Each of the tape drives 12 can mount a tape-containing cartridge (not shown) having magnetic tape 13 for writing (recording) and reading(reproducing) operations. Each tape drive 12 has a multi-track multi-gap head or transducer assembly 15. Head assembly 15 can be constructed as shown in U.S. Pat. No. 5,161,299 by E. Dennison et al and assigned to IBM Corp. This patent shows deposited gaps and a gap array having a write gap and a read gap for each track to be scanned. The gap arrangement is alternated such that the head can write in either direction of relative tape movement. Each of the write gaps and read gaps simultaneously scan respective tracks, such as tracks 19 (not all tracks are shown) diagrammatically shown on tape 13. The number of tracks concurrently receiving data vary, in the illustrated embodiment from four to thirty-two tracks. That is, a number of tracks on a tape may vary from 32 to 128 or more, for example. On the 32 track tapes four tracks concurrently receive data for recording and yield data during reading. The larger the number of tracks on a tape in a higher performance recording system, the greater number of tracks concurrently receiving and yielding data. Numerals 16, 17 and 18 respectively indicate longitudinal boundaries of data recorded from one later-described created array shown in FIG. 2. Magnetic tape 13 may have more tracks 19 than read-write gap pairs on head 15. Head 15 is then movable laterally across magnetic tape 13 for accessing different groups of tracks, each group having a number of the write-read gap pairs for one direction of relative tape motion equalling the number of said gap pairs.

Random access memory (RAM) 20 receives and stores data, as detailed later with respect to FIG. 2, to be written on tape 13. During read operations RAM 20 stores data that has been successfully read from tape 13. Assume that data are to be written on tape 13. While such data are being stored in RAM 20, ECC-1 21 generates columnar error detecting and correcting redundancies for the data bytes in respective columns and stores the redundancies with the columns of data, as will become apparent. The RAM 20 stored data are moved to rotator and interleaver (RI) 23 for rearranging the data bytes as later described. The rotated and interleaved array data may be alternately stored in two RAMs bank 1 23-1 and bank 2 23-2. Then, the data to be recorded pass through ECC-2 circuit 22 for generating error detecting redundancies for each row of data in the created array. ECC-2 circuit 22 appends the generated redundancies to each row of data as the row passes to the write track circuits 24 for writing the data to the respective tracks. There is one write track circuit for each track to be written to.

In accordance with one aspect of this invention, RI 23 manipulates the data array for concurrently writing into either 4, 8, 16 or 32 tracks 19. Similarly, the later described read track circuits can recover data from tape 13 whether recorded in 4, 8, 16 or 32 tracks 19, provided of course that a suitable head assembly is provided.

Write track circuits respectively cooperate with ECC-3 circuits 25, one circuit 25 for each write track circuit, for adding a third ECC redundancy for each array row of data bytes that are recorded in a track, as will become apparent. Such redundancy enables error detection and correction in the respective recorded array rows. The data writing includes one or more created arrays of data for writing into portions 16-17, 17-18 etc. on tape 13. Each physical block of data written on tape 13, as later described, contains an integral number of such created data-ECC redundancy arrays.

Tape drive 12 reads data in a block (16–17) from tape 13. A set of read track circuits 30 receive the read signals from the reading tape drive 12. Circuits 30 detect the data in a known manner. One ECC-3 error detecting circuit 33 is attached to each of the plurality of read circuits 30. ECC-3 detects and corrects data errors in ones of the read array rows in the respective data sets. In the event ECC-3 detects but does not correct its detected data errors in the respective array rows, suitable pointer signals are sent to pointer circuit 97.

Following the ECC-3 data correction, each circuit 30 cooperates with ECC-2 error detecting circuits for detecting bytes in error in the respective block rows of data. Circuits 30 operate independently of each other, a small portion of each circuit 30 operates at a clock speed and phase slaved to the track being read, as is known.

Each of the circuits 30 supplies data from its respective detected set of data to de-rotate and de-interleave circuit (DI) 33. In a constructed embodiment, the data transfer was one data byte at a time. In DI circuit 33, the input addressing circuits for memory 34-35, uses address sequences for the various read circuits that de-rotate and de-interleave the data as data are stored into the memory 34-35 to create read or retrieved data array that is a replica of the original FIG. 2 illustrated data-ECC redundancy array. Deskewing between successive read arrays is achieved by storing the data in either bank 1 memory 34 or bank 2 memory 35 at the appropriate storage locations. DI circuit 33 cooperates with the read track circuits on a one-by-one basis. DI circuit 33 also de-commutates data from the read track circuits 30 to the memory banks 34 and 35, as will become apparent. As one bank, such as bank 1, fills with data, some of the read track circuits may finish reading data before other read circuits for bank 1 due to read data skew. At this time, as a deskewing operation, the early finishing read track circuits begin supplying data bytes from a second read array into bank 2. As soon as all of the read track circuits 30 finish supplying data to bank 1, bank 1 is full and ready for error detection and correction by ECC-1 circuit 36 (the outer code circuit).

Error pointers generated in read track circuits 30, as by detection of illegal recording code words, clock errors, ECC-2 and any ECC-3 generated error pointers are sent to be stored in ancillary buffers addressably associated with the read arrays such that ECC-1 circuit can access the read circuit generated error pointers for correcting bytes in error of each read array.

ECC-1 circuit 36 detects and corrects data errors in the read or retrieved array of data. The buffered error pointers are used to assist in the error correction, as is known. The corrected data are supplied to RAM 20 for transmittal to a data requesting host processor 10. Other circuits 39 in peripheral controller 11 represent all other circuits usually found in such a peripheral controller, such as host processor attachment circuits, timing circuits, control circuits of all types, etc.

Figure 2:
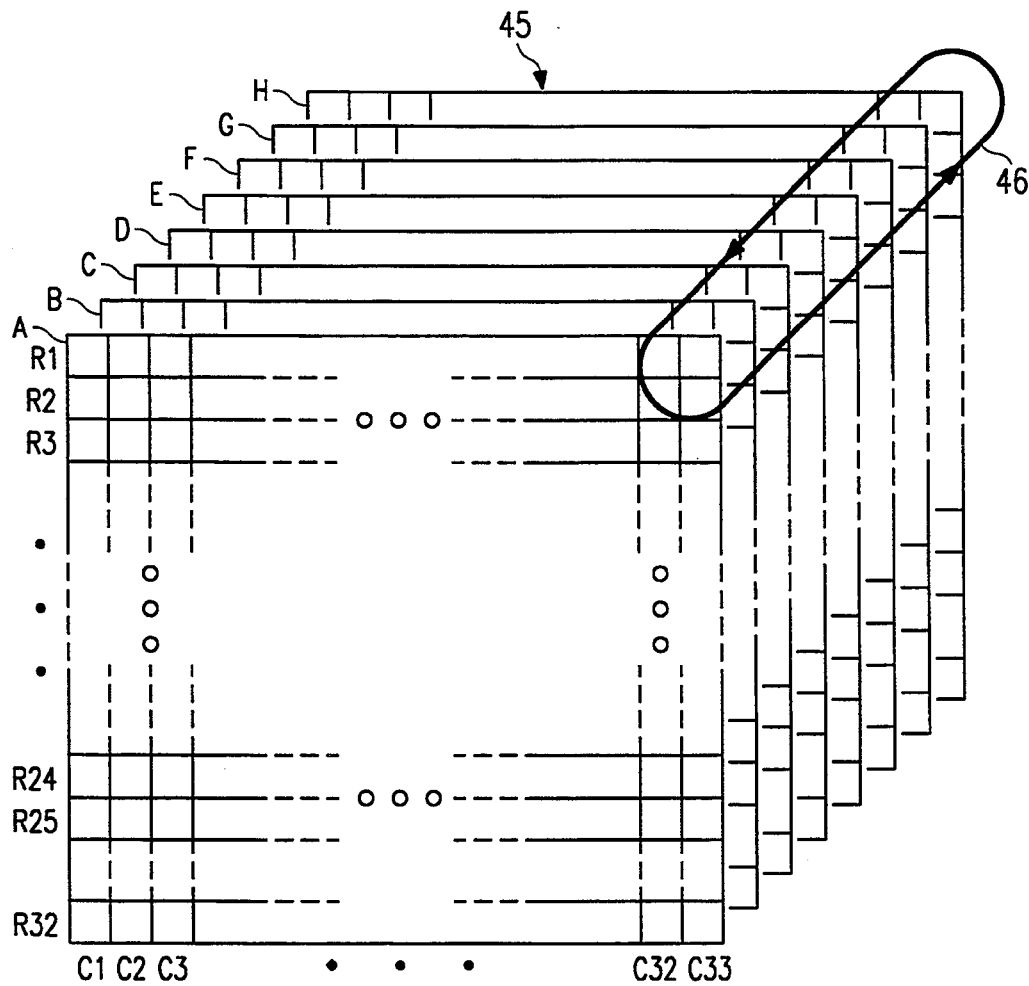
FIG. 2 diagrammatically illustrates an original array of data bytes and error redundancies for the FIG. 1 illustrated system.

FIG. 2 diagrammatically shows one created array 45 of data bytes and ECC redundancy bytes. One of these arrays are recorded as a unit in either 4, 8 or 16 concurrent tracks. For concurrent recording in 32 tracks, two arrays 45 are interleaved, as will become apparent. A greater number of concurrent tracks may be used in connection with practicing this invention. Array 45 consists of eight (8) blocks of data A–H. Such blocks A–H of data each can reside in respective portions of RAM 20 and are separately addressable in this manner. Each block of data has a plurality of block data rows R1–R32 and a plurality of data columns C1–C32. Column C33 is a phantom column as will become apparent for representing the ECC-2 error detecting (EDC) redundancy bytes. Each column-row intersection represents one byte of data. Therefore, each block row has 32 bytes of data while each column has 32 bytes of data. An array row consists of eight block rows, one block row from each of the blocks A–H having a same relative position constitutes an array row. That is, all of the block rows R1 in the blocks A–H constitute one array row.

Each intersection in the array 45 is identified by its column and row number, such as the upper left byte in block A is A-R1C1. Block rows are identified by block and row, that is A-R1 represents one block row of data. Columns are similarly identified as A-C1, etc. A range of rows is represented as A-R1 . . . R24, a range of columns is identified as A-C1 . . . C32. An array row is represented by R1-A . . . H, etc.

The data bytes to be stored in tape 13 are serially received from a host processor 10 are stored in RAM 20 in ranges A-R1C1 . . . R24C32 (a 24 high by 32 wide array of received data bytes). Each block A–H has host processor data stored in this range. The ECC-1 first or error correcting (ECC) redundancy bytes are in byte locations R25C1 . . . R32C32. Each of the columns C1 . . . C32 has a separate redundancy in rows R25 . . . R32 for the data in the respective columns C1 . . . C32 stored in rows R1 . . . R24. The second or inner code ECC-2 has redundancy error detecting bytes added after RI 23 rotates and interleaves the rows of data as later described. Such second redundancy is represented by column C33 in all rows R1 . . . R32. The ECC-3 created redundancies are not shown in FIG. 2. The ECC-3 redundancies are created for each array row (eight block rows).

As data bytes are serially received from a sending host processor 10, the bytes are stored in RAM 20 beginning at array location A-R1C1, then serially proceeding in the column A-C1 to A-R24C1. ECC-1 circuit processes each received data byte before each data byte is stored in RAM 20 such that as the last byte for column C1 is stored, the redundancy bytes are stored in byte locations A-R25C1 . . . R32C1. The data storage rate in RAM 20 is higher than the received rate.

The data byte storage in RAM 20 then proceeds to A-C2 for repeating the above-described procedure. This procedure is repeated for each column in each of the blocks A-H until a complete created array 45 is generated. At this point, the created array 45 is ready for further processing. RAM 20 may have sufficient data storage capacity and access rates for enabling creating a second array 45 whilst the above-described created array 45 is being further processed.

Before describing the further array 45 processing, a description is made of so-called set arrangements for storing created array 45 in tapes using a tape head 15 that may record and read concurrently from a diverse number of tracks. Each set of data is recorded bit serially in respective ones of the concurrent tracks. Table I below illustrates how the 256 rows of data bytes in created array 45 are arranged in respective sets for differing numbers of tracks. For 32 tracks, two arrays 45 are interleaved on tape 13 in each error detecting and correcting area of the data block, as will become apparent. The "*" indicates two arrays 45 in the table below.

TABLE I

| Number of concurrent Tracks | Number of block rows per set | Number of sets | Number of rows per block per track |
|---|---|---|---|
| 4 | 64 | 4 | 8 |
| 8 | 32 | 8 | 4 |
| 16 | 16 | 16 | 2 |
| 32* | 16* | 64* | 2 ea array |

The table above shows that the distribution of the rows by end-around rotation or shifting (see loop arrow 46 in FIG. 2) of block rows of data within array rows of each set distributes the block rows evenly across and longitudinally of the tape for a maximal physical spacing between the rows of data bytes in a minimal area. Such even spatial distribution of the data reduces the number of data errors for one tape caused error (surface defect, for example or debris on the tape) thereby reducing the number of data errors in each of the columns of data in the non-rotated non-interleaved array. Such data error reduction enhances the error detection and correction.

The table below is an abbreviated showing of the row distribution in a concurrent 16-track recording.

TABLE II

| Track number | First Block Row | Row sequence 16 rows per track |
|---|---|---|
| 1 | A-R1 | A-R1..H-R1<br>A-R2..H-R2 |
| 2 | B-R3 | B-R3..H-R3,A-R3<br>B-R4..H-R4,A-R4 |
| 3 | C-R5 | C-R5..H-R5,A-R5,B-R5<br>C-R6..H-R6,A-R6,B-R6 |
| 4 | D-R7 | D-R7..H-R7,A-R7..C-R7<br>D-R8..H-R8,A-R8..C-R8 |
| 5 | E-R9 | E-R9..H-R9,A-R9..D-R9<br>E-R10..H-R10,A-R10..D-R10 |
| 6 | F-R11 | F-R11..H-R11,A-R11..E-R11<br>F-R12..H-R12,A-R12..E-R12 |
| 7 | G-R13 | G-R13,H-R13,A-R13..F-R13<br>G-R14,H-R14,A-R14..F-R14 |
| 8 | H-R15 | H-R15,A-R15..G-R15<br>H-R16,A-R16..G-R16 |
| 9 | A-R17 | A-R17..H-R17<br>A-R18..H-R18 |

Table II can be completed for tracks 10–16 by adding 16 to the track numbers 1–8 and 16 to each of the row values in the other two columns. Other tables can be similarly created for different numbers of concurrently recorded tracks.

Figure 3:
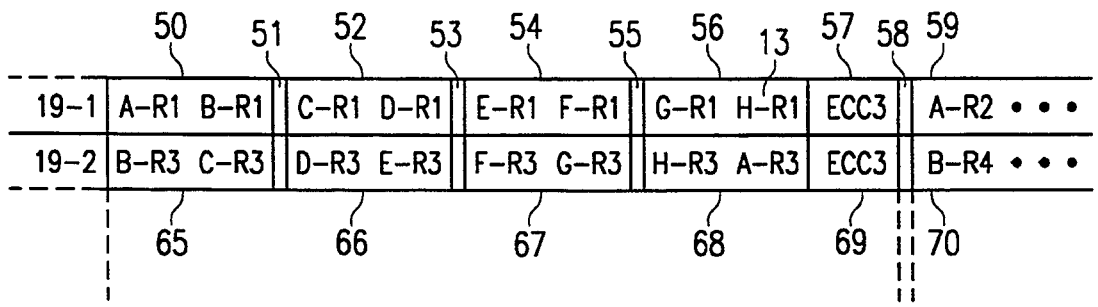
FIG. 3 illustrates a portion of the FIG. 1 illustrated magnetic tape medium for illustrating the effects of rotating rows of data within respective sets of the FIG. 2 illustrated array.

FIG. 3 illustrates a partial format of a 16-track recording on tape 13. Tracks 19-1 and 19-2 are diagrammatically partially shown. Track 19-1 is track number one that stores the first set of rows as shown in Table II. The figure assumes that all other recording controls have been processed, i.e. a read clock is in sync and byte boundaries have been identified in a usual manner. Rows A-R1 and B-R1 are written in track section 50 (a total of 66 bytes) followed by a so-called byte resync indicator 51 of known design. Then next track section 52 stores rows C-R1 and D-R1. Byte resync 53 follows track section 52. Then track section 54 storing rows E-R1 and F-R1 precedes third byte resync pattern 55. Then track section 56 stores rows G-R1 and H-R1 followed by the ECC-3 redundancy in track section 57. In this instance ECC-3 detects errors in an array row of data A . . . H-R1. Byte resync 58 is disposed between ECC-3 redundancy at 57 and a next eight block rows in area 59 of track 19-1. Track 19-1 contains block rows A-R2 . . . H-R2 (one array row A . . . H-R2) using the same format for sections 50-58 including the ECC-3 and the byte resync's. Similarly, track 19-2 includes the resync patterns 51, 53, 55 and 58 for separating rotated block row pairs B-R3, C-R3 in section 65, D-R3, E-R3 in section 66, F-R3, G-R3 in section 67 and H-R3, A-R3 in section 68.

An ECC-3 redundancy is recorded in section 69. Area 70 stores the last block rows in the track 19-2 set of rows, as listed in Table II. All other tracks are similarly formatted. A concurrent 32-track recording interleaves two arrays 45 as later described.

Figure 4:
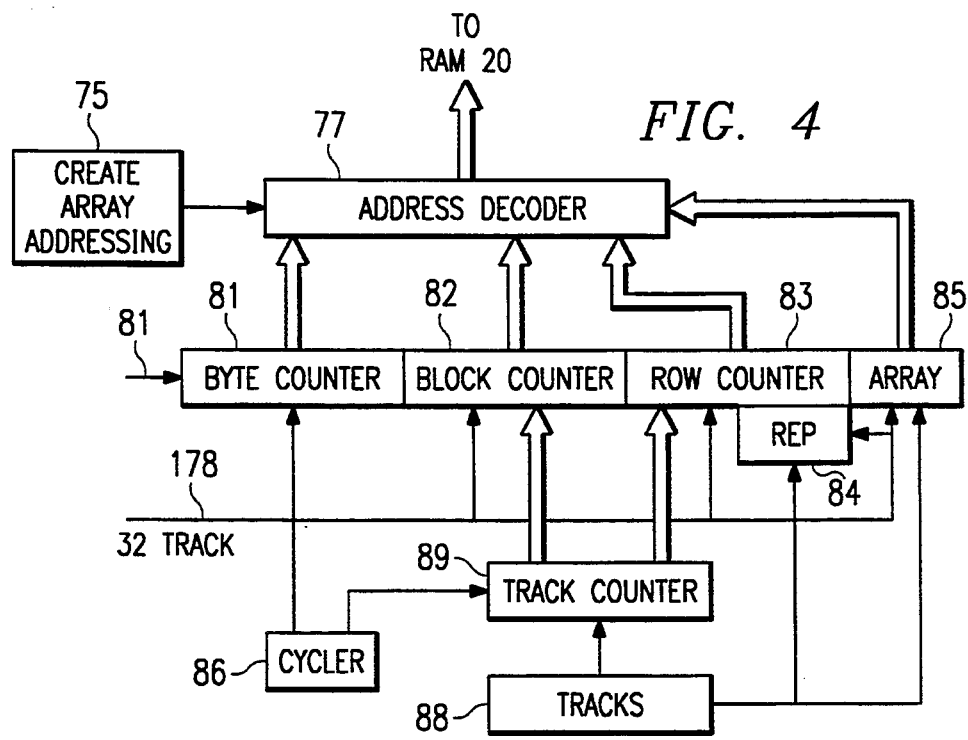
FIG. 4 illustrates, in simplified form, an block row rotator and array row interleaver for generating the format shown in FIG. 3.
Figure 8:
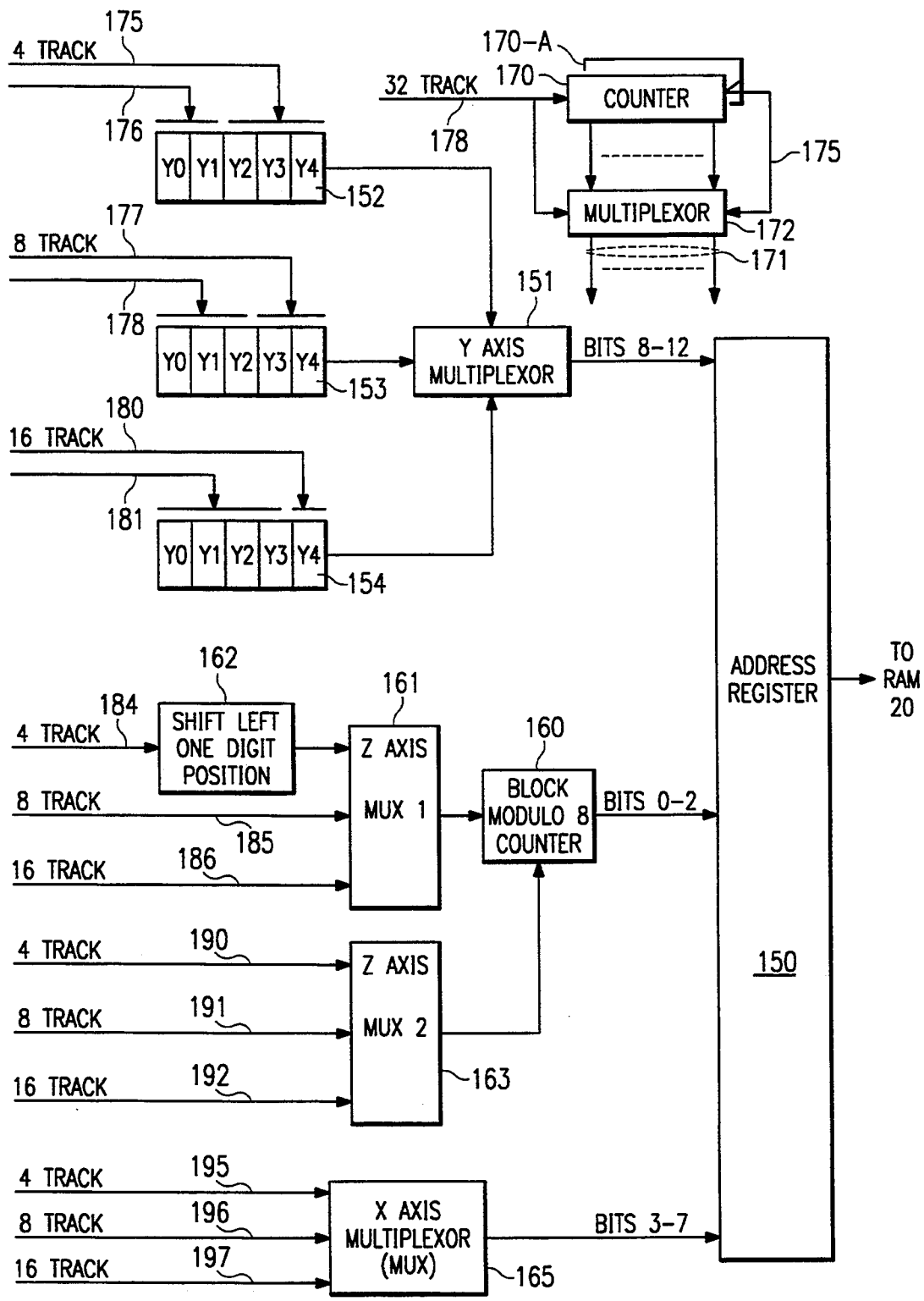
FIG. 8 illustrates in simplified logic form, a preferred block row rotator and array row interleaver for the FIG. 1 illustrated subsystem.

FIG. 4 shows, in simplified form, RI 23 for rotating and interleaving the rows of a data array for up to sixteen concurrent tracks. A preferred constructed embodiment of RI 23 is shown in FIG. 8. Address decoder 77 supplies each byte address to RAM 20. Decoder 77 further arranges the later-described count values to the addressing arrangement of RAM 20, as is known. Byte counter 81 counts the bytes in each of the rows of array 45, i.e. generates the least significant digits of the address. Block counter 82 counts the blocks A-H, hence is a modulo 8 counter. Counter 83 counts the rows in each set. Block counter 82 cycles once for each count of row counter 83. REP circuit 84 indicates to block counter 82 the block number that is to start and end each set, i.e. solves the rotation formula. That is, block counter 82 may start at 1, 2, etc. depending on which of the blocks A-H are to supply the first row in a set. Array counter 85 is a one bit counter for the 32-track recording operations.

Cycler 86 steps the counters 81–85 and supplies a signal to RAM 20 for readout to the respective write track circuit indicated by track counter 89. Track counter cycles through the track numbers for selecting the write track circuit. Track counter also supplies the track number to the block counter 82 and row counter 83 for solving the respective formulae. The number of tracks being recorded is indicated in TRACKS circuit 88. Circuit 88 controls the modulus of counter 89, REP circuit 84 and array counter 85 (on or off).

A concurrent 32-track recording interleaves two arrays 45 in any one of several interleave patterns. Such array interleaving records like array sets in each track, that is track 1 receives a first array set from both arrays, track 2 receives a second array set from both arrays, etc.

The array interleaving alternates such array sets from the two arrays in the data tracks between a first or leading position and a second or trailing position in each track. If it is desired to provide the interleaving alternation on a track-by-track basis, then a first data array has its sets in the first position in all odd numbered tracks while a second data array has its sets in the even numbered tracks. The array sets are reversed for the second or trailing position in the tracks. Array register 85 is a one bit register that is toggled each time the indicated array rows of a leading array have been sent to the write track circuits. Such toggling selects a different array portion of RAM 20, for example. The operation of RI 23 alternates between the arrays, each cycle of interleaving and rotating the indicated array rows is repeated for the trailing array.

Such array rows from two created arrays 45 (array 1 and array 2) can be interleaved in an alternate leading and trailing locations in the respective groups of any arbitrary number of tracks. For example, groups of eight tracks may be selected. In any 32-concurrent track recording, a integral number of the two-array interleaved data constitute a data block.

Line 178 carries a 32-concurrent-track indicating signal from other circuits 39 for controlling array register 85 to toggle its value between array 1 and array 2 as indicated above. Further, the block counter 82 and row counter 83 repeat their respective counts for array 1 and array 2. Two counters may be used, one for array 1 and one for array 2. In this illustration, one array, array 1 or array 2 is processed at a given instant.

Figure 5:
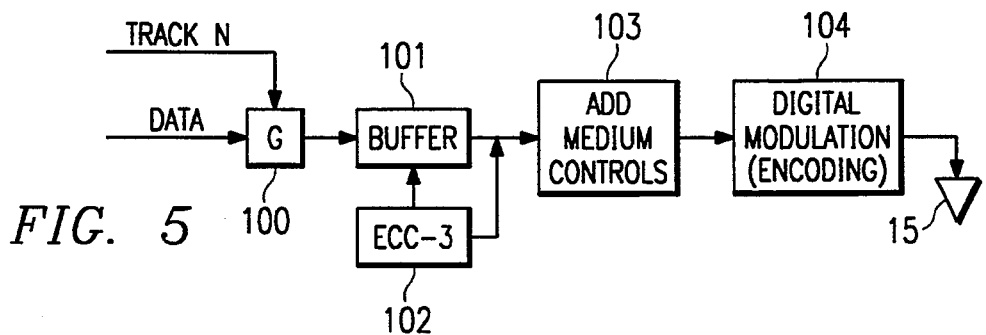
FIG. 5 illustrates, in a simplified block form, a write channel of the FIG. 1 illustrated subsystem.

FIG. 5 shows, in simplified form, a write track circuit.

Table III below illustrates how two created arrays are interleaved and recorded on a 32-track tape.

TABLE III

| ARRAY SEQUENCE | LEAD | ARRAY ROW LAG | TRACK NUMBER |
|---|---|---|---|
| odd | 1 | 2 | odd |
| odd | 2 | 1 | even |
| even | 2 | 1 | odd |
| even | 1 | 2 | even |

Table III shows the alternation of data from arrays 1 and 2 in the odd and even numbered tracks. The lead column indicates which array supplies a row of data as a first or lead recorded data while the lag column lists the second or lagging recorded data source. The track number column indicates track numbers as being either odd or even. The ARRAY SEQUENCE column indicates the above-described alternation (odd and even) of array 1 and array 2.

Gate 100 receives data from RAM 20 and a TRACK N signal from counter 89 (FIG. 4) for passing the RAM 20 data to buffer 101. ECC-3 circuit 102 adds the ECC-3 redundancy to the data as it passes through buffer 101. Circuit 103 adds the usual medium control signals, such as a block preamble, byte resync and the like. Digital modulation circuit 104 encodes the data into a digital modulation or recording code, such as a 1,7 d,k code for recording on tape 13 via head 15. The usual analog amplifiers, etc. are not shown. Write track circuits operate identically irrespective of the number of concurrent tracks.

Figure 6:
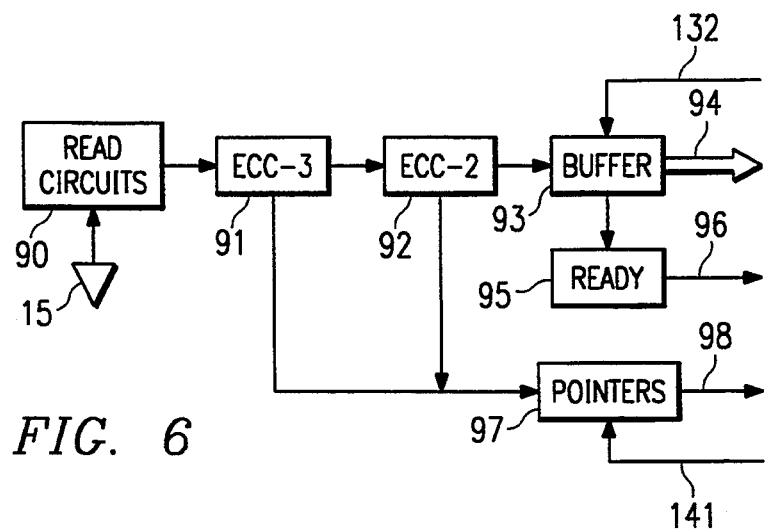
FIG. 6 illustrates, in a simplified block form, a read or reproducing channel of the FIG. 1 illustrated subsystem.
Figure 7:
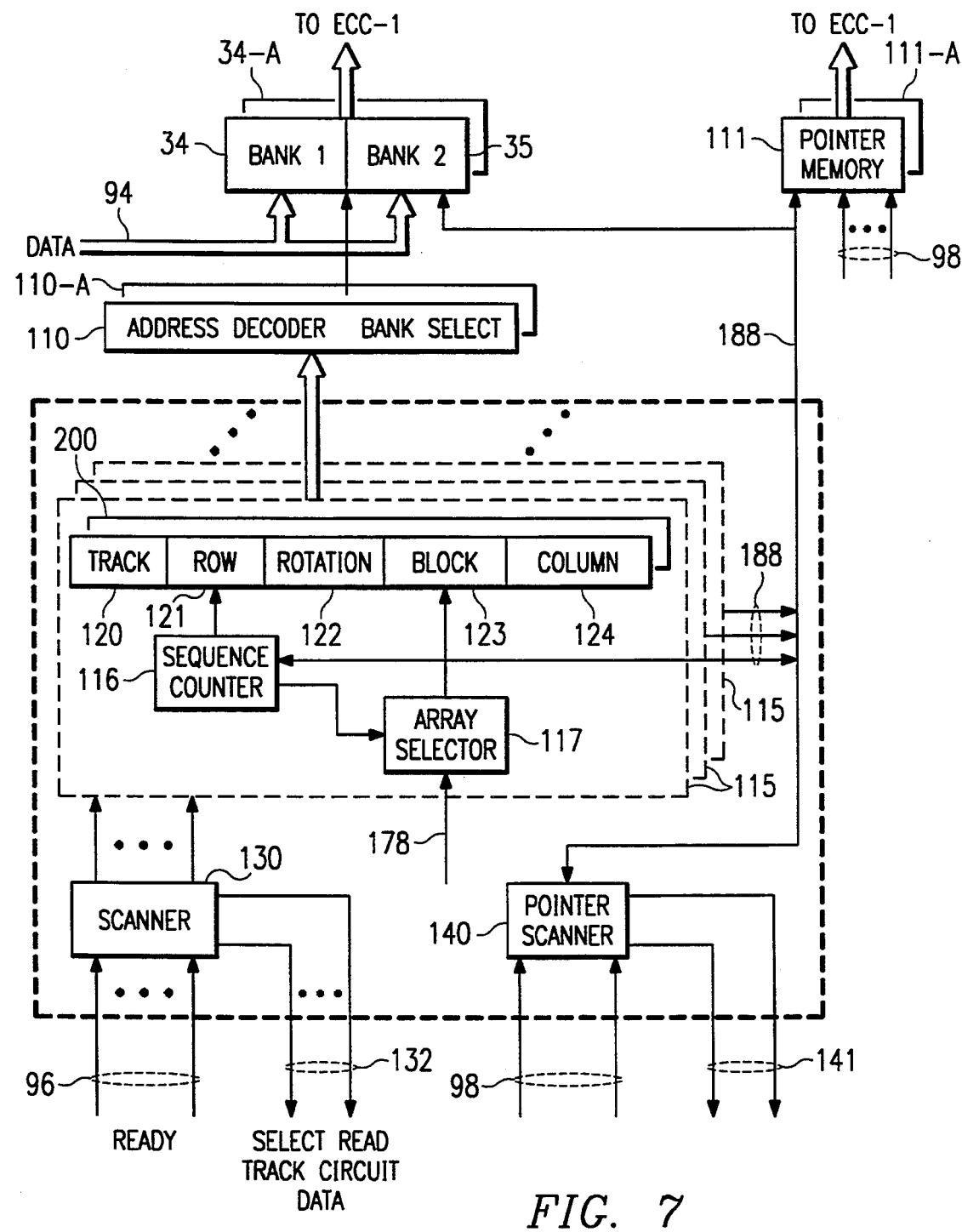
FIG. 7 illustrates, in a simplified flow diagram form, a de-rotator and de-interleaver of the FIG. 1 illustrated subsystem.

FIG. 6 is a simplified showing of a read track circuit 30. The one track read signal (not shown) from head 15 travels through the usual read circuits 90 for amplification, compensation and detection including converting a d,k recording code to NRZ data signals. ECC-3 circuit 102 processes the read data for detecting and correcting short errors in the array row portions of each read set. Detected errors are indicated to pointer circuit 97 for later transmission to a pointer memory (FIG. 7). ECC-3 circuit may have error correction capability for correcting up to two bytes in error. Similarly, ECC-2 circuit 92 processes the read data for detecting errors in the respective rows, there being one error detecting redundancy for each row. Detected errors in a row are supplied to a separate latch in pointers circuit 97 to await transmission to ECC-1 circuit 36. The read data then is de-serialized into byte buffer 93. As soon as one data byte is stored in buffer 93, ready latch 95 is set to the active condition for signalling DI circuit 33 that a byte of data is ready to be transmitted. DI circuit responds to the line 96 ready signal by sending read-out signal over line 132 to buffer 93 for transferring one byte of data to DI circuit 33 and to reset latch 95 to the not-ready state. Except for addressing as shown in FIG. 7, read track circuits 30 operate identically irrespective of the number of concurrent tracks.

Read circuits 90 may detect an error in the d,k read signals. Such detected errors are indicated to pointers circuit 97 for temporary storage and transmission to ECC-1 circuit 36 with the row of data signals, as will become apparent. Each of the three types of pointers are separately stored in pointers circuit 97. Pointer circuit 97 having one pointer stored therein supplies the one-bit pointer signal over line 98 to DI 33. DI circuit 33 reads the pointer signal and supplies a reset signal over line 141 for resetting the pointer bit latches(not shown).

DI circuit 33 is best seen in FIG. 7. DI 33 includes one address generation circuit 115 for each of the read track circuits 30. In a 16-track read operation, there are 16 active address generation circuits 115, each such circuit having an fixed sequence of address generation for de-rotating and de-interleaving the data bytes for each respective track, such as set forth in the tables above. Each circuit 115 includes a fixed sequence counter 116 for counting the data byte transmission from its circuit 30 to memory 34–35. The address generation is created by track counter portion 120 that is set to a fixed value, row counter 121 that counts the rows to which the read data bytes are to be transmitted, rotation counter 122 that adjusts the block counter 123 to start counting at a respective one of the blocks A–H and column counter 124 that counts the byte locations (columns) in the read or retrieved array being generated in memory 34–35.

Scanner 130 continuously scans, at high speed, the ready latches 95 for finding filled byte buffers 93. The scan is round robin. A first detected ready latch 95 in the ready condition interrupts the scanner 130. Scanner 130 responds by activating the respective address generation circuit 115 for generating a next address for memory 34–35. Simultaneously, scanner 130 supplies a buffer read signal over the respective buffer read line 132 for actuating the respective byte buffer 93 to supply its stored byte of data over bus 94 to memory 34–35 for storage in the byte location indicated by the respective address circuit 115.

Pointers stored in read track circuits 30 are indicated to pointer scanner 140. Scanner 140 senses the pointer ready signal on the line 98 (one pointer is active). Pointer scanner 140 then sends a pointer read signal over the respective line 141 to pointer memory 111 for receiving the pointers and to clear the pointers circuit 97. If no pointer is present, then pointer memory receives no signal. Each of the lines 98 is directed to a three bit register, one bit for each of the pointers. Memory 111 supplies the stored pointer signals to ECC-1 circuit 36.

Pointers are sent to ECC-1 circuit 36 whether zero (no error) or one (error). As soon as bank 1 or bank 2 of memory 34-35 is full and the error pointers are in ECC-1 circuit, ECC-1 circuit reads the data from the respective memory bank. The addresses that the pointers are stored in memory 111 are logically associated with the data in memory 34-35 in a usual manner. Pointer memory 111 has one portion for each of the banks 1 and 2. Therefore, as bank 1 is being read by ECC-1 circuit 36 the bank 2 pointers are being stored into pointer memory 111 all under control of bank select portion of address decoder 110.

Line 178 from other circuits 39 carries a 32-track signal for indicating that 32 concurrent tracks are being read. While line 178 carries an indication of other than 32 concurrent tracks, then the above-described operation occurs, i.e. one retrieved array is being generated. For 32 concurrent tracks two retrieved arrays are generated by de-interleaving the two arrays being read from tape 13. Array selector 177 responds to the line 178 signal indicating 4, 8 or 16 concurrent tracks to emit a no-action signal over line 188 to always select the above described elements to process array 1. Array selector 177 responds to the line 178 signal indicating 32 concurrent tracks and to sequence counter 116 indicating that one set of data from one array has been read from respective ones of the tracks and activating signal over line 188 for toggling later-described controls to switch processing from either array 1 to array 2, or vice versa. Each of the address generation circuits 115 include two address circuits. The address elements 120-124 constitute a first address circuit used for processing array 1 while numeral 200 indicates a second address circuit, identical to elements 120-124, for generating addresses to process array 2. While array selector 117 is emitting an active signal, array 2 is being processed such that sequence counter 116 increments address circuit 200. Similarly, the line 188 active signal selects a second pointer memory 111-A and second memory 34-A. Address decoders 110 and 110-A are similarly selected respectively for processing array 1 or array 2. When either array 1 or array 2 have been completely read, ECC-1 processes the error pointers and data in a usual manner.

The three ECC codes may use the following generator polynomials:
For ECC-1:

$$G(X) = X^8 + \alpha^{176}X^7 + \alpha^{240}X^6 + \alpha^{211}X^5 + \alpha^{253}X^4 + \alpha^{220}X^3\alpha^3X^2 + \alpha^{203}X + \alpha^{36}$$

For ECC-2 (error detection only):

$$G(X) = X + \alpha$$

For ECC-3 (error detection and correction):

$$G(X) = X^4 + \alpha^{74}X^3 + \alpha^{247}X^2 + \alpha^{75}X + \alpha^2$$

where GF(256) is constructed using a primitive polynomial $$P(x) = X^8 + X^3 + X^2 + X + 1$$

for all three generator polynomials.

The primitive element $\alpha = 00000001$ in the three generator polynomials.

FIG. 8 illustrates in simplified form a preferred interleaver logic arrangement for efficiently providing diverse track interleaving. The theory for RI 23 is based on the three-dimensional showing of FIG. 2. The interleaver uses the three ordinates X, Y and Z. Ordinate X indicates the horizontal offset or column number (enumerated 0-31 rather than 1-32), ordinate Y indicates the vertical offset or row of data bytes (enumerated 0-31 rather than 1-32) and ordinate Z is the depth ordinate or the block address A-H (enumerated 0-7). The row rotation or shifting within set is determined by a modulo-8 adder.

Table IV below illustrates the calculation of the X, Y and Z data array offsets that lead to a linear memory address for RAM 20 that simultaneously effects the interleaving and row rotation or end-around shifting of block rows within each array row.

TABLE IV

| Number of concurrent tracks | X offset column number | Y offset row number | Z offset block number modulo 8 |
|---|---|---|---|
| 4 | Column number | (8*TRK)+ROW | 2*TRK + BLK |
| 8 | Column number | (4*TRK)+ROW | TRK + BLK |
| 16 | Column number | (2*TRK)+ROW | TRK + BLK |

In Table IV, TRK indicates a Y-offset in a data array representing which group of eight block rows are being addressed, BLK means the block number 0-7 respectively to address blocks A-H and ROW indicates the block in which a row is to be read within an array row. The RAM 20 buffer address is calculated using the equation below:

$$Address = (Z*1024) + (X*32) + Y \qquad (1)$$

The modulus of the values TRK and ROW vary with the number of concurrently recorded tracks. The data row byte address is a constant 5-bit quantity while the BLK value (selects a block A-H using an address value of 0-7) has a constant modulus of 3 bits. The ROW modulus for four concurrent tracks is three bits, two-bits for eight concurrent tracks and one bit for 16 concurrent tracks.

The FIG. 8 illustrated address-mapping logic calculates the X, Y and Z data array values for insertion into 13-bit address register 150. The RAM 20 address consists of the Y offset as the five lowest significant bits 8-12 received through Y multiplexor 151, the middle significant bits 3-7 as the X offset via X multiplexor 165 and the highest order bits 0-2 from the modulo 8 Z offset adder 160. A thirteen-bit counter 170 cycles once to create the RAM 20 addresses for one of the created arrays 45. Counter 170 has thirteen output lines 171 that are connected to the inputs of the address-mapping logic as shown below in TABLE V.

TABLE V

| counter output Line number | input line numbers to address-mapping logic | | |
|---|---|---|---|
| | 4-track input line number | 8-track input line number | 16-track input line number |
| 0 | 175-Y2 | 177-Y3 | 180-Y4 |
| 1 | 175-Y3 | 177-Y4 | 192-B0 |
| 2 | 175-Y4 | 191-B0 | 192-B1 |

TABLE V-continued

| counter output Line number | input line numbers to address-mapping logic | | |
| --- | --- | --- | --- |
| | 4-track input line number | 8-track input line number | 16-track input line number |
| 3 | 190-B0 | 191-B1 | 192-B2 |
| 4 | 190-B1 | 191-B2 | 197-C0 |
| 5 | 190-B2 | 196-C0 | 197-C1 |
| 6 | 195-C0 | 196-C1 | 197-C2 |
| 7 | 195-C1 | 196-C2 | 197-C3 |
| 8 | 195-C2 | 196-C3 | 197-C4 |
| 9 | 195-C3 | 196-C4 | 181-Y0 |
| 10 | 195-C4 | 185-Z0 & 178-Y0 | 186-Z0 & 181-Y1 |
| 11 | 176-Y0 & 184-Z0 | 185-Z1 & 178-Y1 | 186-Z1 & 181-Y2 |
| 12 | 176-Y1 & 184-Z1 & 184-Z2 = 0 | 185-Z2 & 178-Y2 | 186-Z2 & 181-Y3 |

In TABLE V, the term Y means vertical ordinate or row number (R1–R32; 0–31), B means block A–H (0–7), T means track number, and C means column number for indicating a byte in each of the rows.

For processing a 32-track concurrent recording, a second byte counter 170-A and multiplexor 172 is added. The line 178 signal controls counters 170 and 170-A to respectively increment whilst array 1 and array 2 are being processed, as shown in TABLE III, above, in the array row column. Multiplexor 172 responds to the line 175 signal from either counter 170 or 170-A reaching the trigger count for switching processing between array 1 and array 2. The lines 171 have connections as above described.

While the invention has been particularly shown and described with reference to preferred embodiments thereof, it will be understood by those skilled in the art that various changes in form and details may be made therein without departing from the spirit and scope of the invention.

What is claimed is:

1. A method of recording and reading data onto and from a record medium that includes an error detecting and correcting redundancy; the steps of:

selecting a given plurality of data bytes to be recorded;

in a random access memory, creating a block array of first data bytes in a rectangular block array of said data bytes, said block array having a first number of columns of said data bytes and second number of rows of said data bytes;

applying a first error detecting and correcting code to said data bytes in each said column of the block array to generate first redundancy bytes for said data bytes in each of said columns, respectively;

adding said generated redundancy bytes to the respective columns for adding a given number of rows to said block array for generating a third number of said rows in said block array;

selecting a predetermined number of adjacent ones of said rows into a given plurality of first sets of rows such that said sets are contiguous in said block array and each set having said predetermined number of said rows;

after said adding and selecting steps, end-around shifting the data bytes in each of said sets of rows a predetermined number of bytes, each set being shifted a different number of bytes;

storing each said shifted sets of rows in respective addressable data storage areas of said record medium such that a first byte of said data in the respective addressable data storage areas are from a different one of said columns;

retrieving said stored shifted sets of rows from said record storage medium, reversely shifting the sets said respective predetermined number of bytes for creating a retrieved array of bytes and arranging the rows in the retrieved array as a replica of the rows in said generated array; and applying said first error detecting and correcting code and said first redundancy bytes to said data in the retrieved array for error detecting and correcting the data in the retrieved array.

2. The method set forth in claim 1, further including the steps:

selecting a plurality of said rows of data bytes to be in each of said sets;

selecting a plurality of said data bytes to be in each of said rows;

including in each said set a like number of said rows;

in said end-around shifting step, shifting all bytes in each respective row as a unit such that said rows in each said set are end-around shifted with respect to each other while not shifting any data bytes within said respective rows with respect to other data bytes in said respective rows; and recording one of said sets in each of said addressable data storage areas, respectively.

3. The method set forth in claim 1, including the steps:

after shifting said data bytes in said sets, applying a second error detecting code to data and redundancy bytes in each row of the block array to generate second redundancy bytes for said rows, respectively such that the second redundancy bytes are for indicating data errors in said rows stored in respective addressable data storage areas;

adding said second redundancy bytes to said rows of the block array before recording said rows onto said record medium.

4. The method set forth in claim 1, including the steps:

selecting said record medium to have a plurality of parallel longitudinal signal storing tracks scanned by respective transducers, aligning said transducers transversely to the longitudinal tracks;

simultaneously relatively moving said transducers and respective ones of said tracks for receiving and storing said sets of data bytes;

inserting into each of said rows a plurality of said data bytes; and in said end-around shifting step; simultaneously and identically successively shifting said data bytes in the respective rows as a single unit of data for relatively end-around shifting said rows with respect to each other and not shifting any byte within any of said rows with respect to any other bytes in a respective row such that said simultaneous recording in the respective tracks record data bytes in each row from different ones of said columns in said created block array are physically spaced-apart on said record medium whereby media defect induced errors from respective areas of the record medium affect different ones of said rows of data bytes for enhancing error correcting capacity of said first error detecting and correcting code.

5. The method set forth in claim 4, including the steps:

in said collecting, creating and applying steps, creating a plurality of said block arrays for creating a multi-block array as a created array;

enumerating said rows in all of said block arrays in a like sequence beginning at a row that is most remote from said rows of first redundancy bytes and ending at a predetermined one of said rows of first redundancy bytes, making all like numbered rows in each of said block arrays being an array row;

creating said sets to include a given number of said array rows; and in said retrieving step retrieving all of said block arrays as one unit of data.

6. The method set forth in claim 5, including the steps:

before recording data bytes within each set of said array rows, applying a third error detecting and correcting code to said data bytes in each said array row to create third redundancy bytes in respective ones of said tracks for detecting a certain number of bytes in error in the respective array rows; and in said retrieving step, before reversely shifting said rows of data bytes, detecting and indicating errors in the respective array rows up to said certain number of bytes in error.

7. The method set forth in claim 5, including the steps:

determining a number of said tracks that are to receive said data bytes; and selecting said predetermined number to have a value in a predetermined inverse ratio to said number of tracks, a greater number of tracks resulting in a smaller value in said predetermined number.

8. The method set forth in claim 5, including the steps:

selecting a second given plurality of second data bytes;

in said random access memory, creating a second created array having a second rectangular block array of said second data bytes, said second rectangular block array having said first number of second columns of said second data bytes and said second number of second rows of said second data bytes;

applying said first error detecting and correcting code to said second data bytes in each said second column of said second created array to generate second redundancy bytes for said second data bytes in each of said second columns of said second block array, respectively;

adding said generated second redundancy bytes to the respective second columns for adding said given number of said second rows to said second block array for generating said third number of said second rows;

selecting said predetermined number of adjacent ones of said second rows into a given plurality of second sets of rows such that said second sets are contiguous in said second block array and each second set having said predetermined number of said second rows;

after said adding and selecting steps, end-around shifting the data bytes in each of said second sets of second rows said predetermined number of bytes, each said second set being shifted a different number of bytes;

storing each said shifted second sets of rows in respective addressable data storage areas of said record medium such that a first byte of said data in the respective addressable data storage areas are from a different one of said columns, including in first predetermined ones of said addressable data storage areas storing said first sets followed by storing said second sets and in second predetermined ones of said addressable data storage areas storing said second sets followed by storing said first sets such that some of said second predetermined ones addressable data storage areas are interleaved with said first predetermined ones of said data storage areas of said record storage medium;

in said retrieving step, retrieving said stored shifted sets of rows from said record storage medium, reversely shifting the sets said respective predetermined number of bytes for creating first and second retrieved arrays of bytes and arranging the rows in the first and second retrieved arrays as respective replicas of the rows in said created first and second block arrays; and applying said first error detecting and correcting code and said first and second redundancy bytes respectively to said data in the retrieved arrays for error detecting and correcting the data in the retrieved arrays.

9. The method set forth in claim 8, including the steps:

in said collecting and creating steps, in each of said first and second created arrays, creating a like plurality of said block arrays;

enumerating said rows in all of said block arrays in a like sequence beginning at a row that is most remote from said rows of first and second redundancy bytes in the respective first and second arrays and ending at a predetermined one of said rows of first and second redundancy bytes;

creating said first and second sets to include like numbered rows from all of said block arrays, respectively in said first and second arrays such that each of said addressable data storage areas receives an identical number of said first and second data bytes from said like numbered respective rows of data bytes, respectively in said first and second sets;

applying said first error detection and correction code to said first and second data bytes in each said column of each said block array in both said first and second arrays to generate first and second redundancy bytes for said first and second data bytes in each of said columns in all of said block arrays, respectively;

in all of said block arrays, respectively adding said generated redundancy bytes to the respective columns for adding a given number of rows to said block array for generating a third number of said rows in each of said block arrays of both said first and second created arrays; and including all of said block arrays of said first and second created arrays in said retrieved array respectively as first and second retrieved arrays.

10. The method set forth in claim 9, including the steps:

before said storing step and after said end-around shifting step, generating a third ECC redundancy in each of said sets for each said array row in both of said created arrays, inserting each said third ECC redundancy after each said array row for being stored therewith in said record member.

11. The method set forth in claim 9, including the steps:

during said retrieving step and before said reversely shifting step portion of said retrieving step, in each retrieved row, error detecting data bytes in said each row for generating an error pointer to the row, storing and indicating said error pointer;

in said retrieving step, detecting errors in format and data for generating additional error pointers for pointing to errors of format and of data; and during said applying step, combining said error pointers to the retrieved array for enhancing error correction.

12. In the method set forth in claim 5, including the steps:

in said end-around shifting step, performing said end-around shifting by the below-listed steps;

incrementing an address counter for each byte transferred up to a given count modulus;

making said count modulus and an address space of said random access memory equal;

determining a number of tracks to concurrently receive said data after said end-around shifting step;

dividing said address space into X, Y and Z address components;

making said X address component a constant range of numbers;

making said Z address component to be modulo $2^N$, where N is a positive integer, summing said determined number of tracks with a number of said block arrays, modulo 8, for generating said Z address component;

summing a product of said determined number of tracks and a current one of said tracks to receive said array rows for generating said Y address portion;

combining said address portions into one value as an address for fetching a byte of data in a predetermined sequence for end-around shifting said block rows within a respective array rows such that a serial flow of bytes of said data have said predetermined sequence.

13. The method set forth in claim 12, including the steps:

incrementing a number representing access to a one of said block arrays for being a next accessed block array address;

in said making said Z address portion step, further for a determined number of tracks equal to four, doubling a current track number value for generating a 4-track partial sum, then adding, modulo 8, a current block array number being next accessed to said 4-track partial sum for generating said Z address portion;

in said making said Z address portion step, further for a k determined number of tracks equal to eight, sixteen or thirty-two, adding said current track number value to said current block array number being next accessed to generate said Z address portion;

in said Y address portion step, further for a determined number of tracks being four, eight, or 16 or 32, respectively multiplying said current track number by 8, 4 or 2.

14. In the method set forth in claim 5, including the steps:

determining said number of tracks to concurrently receive data as 32 tracks;

generating two of said created arrays, performing all of said applying, adding, selecting steps to both of said created arrays;

selecting predetermined portions of each of said created arrays for alternating said predetermined portions for said created arrays laterally of a longitudinal length of said tape such that one portion of each of said arrays are in each of said 32 tracks and that the order of said one portions laterally of said tape alternate every given number of said tracks; and in said retrieving step, de-alternating said portions for regenerating both of said created arrays.

15. The method set forth in claim 5, including the steps:

creating two of said created arrays including generating all of said error redundancies and end-around shifting the rows in each said array row in each of the two created arrays;

grouping the concurrent tracks into a plurality of groups, each group having a like number of said tracks, denominating successive groups as odd and even groups such that said groups alternate between odd and even laterally across the tracks;

recording one set from each of said arrays in each of the tracks; and recording sets from a first one of the arrays first in said tracks in the odd groups and from a second one of the arrays first in said tracks in the even groups.

16. Error detection and correction apparatus for a recording system that has a record medium with a plurality of addressable tracks, an addressable data memory for storing data to be exchanged with said record medium in rows and columns of data bytes, said rows and columns being grouped into block arrays of such data bytes, the improvement including, in combination:

input means for supplying a given plurality of data bytes to be recorded;

array building means connected to said input means for receiving said data bytes and being connected to said addressable data memory for storing said received data bytes into a block array of first data bytes as a rectangular block array of said data bytes such that said block array having a first number of columns of said data bytes and second number of rows of said data bytes;

first error means connected to said data memory and said input means for applying a first error detecting and correcting code to said data bytes in each said column of the block array to generate first redundancy bytes for said data bytes in each of said columns, respectively and for adding said generated redundancy bytes to the respective columns in said data memory for adding a given number of rows to said block array for generating a third number of said rows in said block array;

set means connected to the data memory for selecting a predetermined number of adjacent ones of said rows into a given plurality of first sets of rows such that said sets are contiguous in said block array and each set having said predetermined number of said rows;

interleaving means connected to the data memory and to said set means for retrieving said data bytes from said data memory for end-around shifting the data bytes in each of said sets of rows a predetermined number of bytes such that each set has rows end-around shifted a different number of bytes;

write track means connected to the interleaving means for receiving said shifted sets of rows and being in a recording relationship to the record medium for storing the shifted sets of rows in the respective sets in respective addressable tracks of said record medium such that a first byte of said data in the respective addressable data storage areas are from a different one of said columns of said block array;

read track means being in reading relationship to the record medium for retrieving said stored shifted sets of rows from said record medium;

de-interleaving means connected to said read track means for receiving said retrieved sets of rows for reversely shifting the shifted rows within the respective sets said respective predetermined number of bytes for generating a retrieved array of bytes for arranging the rows in the retrieved array as a replica of the rows in said block array; and said first error means being connected to said de-interleaving means for applying said first error detecting and correcting code and said first redundancy bytes to said data in the retrieved array for error detecting and correcting the data in the retrieved array.

17. The apparatus set forth in claim 16, including, in combination:

said set means having means for selecting a plurality of said rows of data bytes to be an array row in each of said sets such that each set has a like number of said block rows; and said interleaving means end-around shifting the block rows of the respective array rows in the sets said different number of bytes such that each row within the respective array rows are shifted a like number of bytes within each said set.

18. The apparatus set forth in claim 16, further including, in combination:

second error means interposed between said interleaving means and said write track means for applying a second error detecting code to data and redundancy bytes in each said block row to generate second redundancy bytes for said respective rows, such that the second redundancy bytes are for indicating data errors in said rows stored in respective addressable data storage areas;

said write track means being connected to said second error means for receiving said second redundancy bytes for adding said second redundancy bytes to said rows before recording said rows onto said respective addressable tracks; and said second error means having a read error portion in said read track means for detecting errors in the rows for indicating rows having said detected errors.

19. The apparatus set forth in claim 16, further including, in combination:

said array building means having means for generating a created array having a plurality of said block arrays such that each said block array has a like number of said data bytes and said first redundancy bytes;

said means in said array building means enumerating said rows in all of said block arrays in a like sequence beginning at a row that is most remote from said rows having bytes of first redundancy and ending at a predetermined one of said rows of first redundancy bytes and for making an array row of all like numbered rows in said block arrays;

said set means selecting a given number of said array rows for each said set such that each said set has a like number of said array rows; and said read track means and said de-interleaving means for retrieving all of said block arrays as one unit of data.

20. The apparatus set forth in claim 19, further including, in combination:

said write track means having third error means for examining each of said array rows for generating a third error redundancy and for adding said third redundancy to the respective array rows and storing the array rows and the respective third redundancy in respective ones of said tracks; and said read track means having a third error detecting means for examining read array rows and a respective third redundancy for detecting and indicating errors in the respective array row.

21. The apparatus set forth in claim 19, further including, in combination:

said interleaving means having means for determining and indicating a number of said tracks that are to concurrently receive said data bytes; and said interleaving means having means responsive to said indicated number of tracks for selecting said predetermined number to have a value in a predetermined inverse ratio to said indicated number of tracks, a greater number of tracks resulting in a smaller value in said predetermined number.

22. The apparatus set forth in claim 19, further including, in combination:

said input means selecting a second given plurality of second data bytes;

said array building means generating a second created array having a second rectangular block array of said second data bytes, said second rectangular block array having said first number of second columns of said second data bytes and said second number of second rows of said second data bytes;

said first error means for applying said first error detecting and correcting code to said second data bytes in each said second column of said second created array to generate second redundancy bytes for said second data bytes in each of said second columns of said second block array, respectively, and for adding said generated second redundancy bytes to the respective second columns for adding said given number of said second rows to said second block array for generating said third number of said second rows;

said set means selecting said predetermined number of adjacent ones of said second rows into a given plurality of second sets of rows such that said second sets are contiguous in said second block array and each second set having said predetermined number of said second rows;

said interleaving means for end-around shifting the data bytes in each of said second sets of second rows said predetermined number of bytes, each said second set being shifted a different number of bytes;

said write track means receiving said data bytes of said second created array from said interleaving means for storing each said shifted second sets of rows in respective addressable data storage areas of said record medium such that a first byte of said data in the respective addressable data storage areas are from a different one of said columns, including in first predetermined ones of said addressable data storage areas storing said first sets followed by storing said second sets and in second predetermined ones of said addressable data storage areas storing said second sets followed by storing said first sets such that some of said second predetermined ones addressable data storage areas are interleaved with said first predetermined ones of said data storage areas of said record storage medium;

said read track means for retrieving said stored shifted sets of rows from said record storage medium, reversely shifting the sets said respective predetermined number of bytes for creating first and second retrieved arrays of bytes and arranging the rows in the first and second retrieved arrays as respective replicas of the rows in said created first and second block arrays; and said first error means for applying said first error detecting and correcting code and said first and second redundancy bytes respectively to said data in the retrieved arrays for error detecting and correcting the data in the retrieved arrays.

23. The apparatus set forth in claim 22, further including, in combination:

said array building means, in each of said first and second created arrays, generating a like plurality of said block arrays;

said array building means enumerating said rows in all of said block arrays in a like sequence beginning at a row that is most remote from said rows of first and second redundancy bytes in the respective first and second arrays and ending at a predetermined one of said rows of first and second redundancy bytes;

said set means generating said first and second sets to include like numbered rows from all of said block arrays, respectively in said first and second created arrays such that each of said addressable tracks receives an identical number of said first and second data bytes from said like numbered respective rows of data bytes, respectively in said first and second sets;

said first error means for applying said first error detection and correction code to said first and second data bytes in each said column of each said block array in both said first and second arrays to generate first and second redundancy bytes for said first and second data bytes in each of said columns in all of said block arrays, respectively, and for adding said generated redundancy bytes to the respective columns for adding a given number of rows to said block array for generating a third number of said rows in each of said block arrays of both said first and second created arrays; and said read track means and said de-interleaving means dividing said retrieved array respectively into first and second retrieved arrays that are replicas of said first and second created arrays.

24. The apparatus set forth in claim 23, further including, in combination:

third error means in said write track means for generating a third error redundancy for each said array row and appending said third error redundancy to each said array row for being stored therewith in said record member;

said read track means including third error detecting means for analyzing each read said third redundancy and respective array row for detecting errors in read array rows, respectively, and indicating said third redundancy detected errors as respective error pointers to errors in said read array rows;

said read track means having format means for detecting errors in format and data for generating additional error pointers for pointing to errors of format and of data; and said de-interleaving means having error pointer means connect to said read track means for receiving said pointers and being connected to said first error means to supply said error pointers to the first error means and said first error means combining said error pointers with said read first redundancy for enhancing error correction of data in said retrieved array.

25. The apparatus set forth in claim 19, further including, in combination:

a byte counter connected to said interleaving means for supplying a count to indicate to said interleaving means that a predetermined data byte in said created array is being supplied from said data memory, control means connected to said byte counter and to said data memory for actuating the byte counter to increment said count for each byte transferred to said interleaving means from said data memory;

said data memory having an address space for storing said created array having an address range with a count modulus equal to a count modulus of said byte counter;

track means connected to said interleaving means for indicating a concurrent number of tracks to concurrently receive said data in said created array;

logic means in said interleaving means for dividing said address space into X, Y and Z address components;

X means in said logic means making said X address component a constant range of numbers;

Z means in said logic means making said Z address component to be modulo $2^N$, where N is a positive integer, and having adder means for summing said concurrent number with a number of said block arrays in said created array, modulo 8, for generating said Z address component;

Y means in said logic means summing a product of said concurrent number and a current number of one of said tracks to receive said array rows for generating said Y address portion; and multiplexing means in the logic means for combining said X, Y and Z address portions into one value as a data memory address for fetching a byte of data in a predetermined sequence for end-around shifting said block rows within respective array rows such that a serial flow of bytes of said data have said predetermined sequence.

26. The apparatus set forth in claim 25, in combination:

said Z means for receiving from said byte counter means a series of incremented byte counts that represent a data memory access to a one of said block arrays for being a next accessed block array address;

said Z means having 4-track means responsive to said track means indicating a concurrent number of four for doubling a current track number value for generating a 4-track partial sum and supplying said partial sum to said adder means;

block array means supplying to said adder means a current block array number indicating a block array in said data memory being a next accessed block array for adding said 4-track partial sum for generating said Z address portion;

8-track means in said logic means responsive to said track means indicating a concurrent number of eight, sixteen or thirty-two for supplying a current track number value to said adder means;

said adder means adding said current track number value to said current block array number being next accessed to generate said Z address portion;

said Y means being responsive to said track means respectively indicating a concurrent number of four, eight, or 16 or 32, respectively multiplying said current track number by 8, 4 or 2 for generating said Y address portion.

27. The apparatus set forth in claim 19, including, in combination:

repeat means connected to said array building means, to said first error means, to said set means, to said interleaving means for creating two of said created arrays including generating all of said error redundancies and end-around shifting the rows in each said array row in each of the two created arrays;

said repeat means having group means for grouping the concurrent tracks into a plurality of groups such that each group has a like number of said tracks and for denominating successive groups as odd and even groups such that said groups alternate between odd and even laterally across the tracks;

said group means having alternating means for recording one set from each of said arrays in each of the tracks; and said alternating means having switching means for actuating said interleaving means to successively processing first sets from a first one of the created arrays and then sets from a second one of the arrays for recording sets from a first one of the arrays first in said tracks in the odd groups and from a second one of the arrays first in said tracks in the even groups.

* * * * *